United States Patent [19]
Tomita et al.

[11] Patent Number: 5,912,858
[45] Date of Patent: Jun. 15, 1999

[54] CLOCK-SYNCHRONIZED INPUT CIRCUIT AND SEMICONDUCTOR MEMORY DEVICE THAT UTILIZES SAME

[75] Inventors: Hiroyoshi Tomita; Yuji Kurita, both of Kawasaki, Japan

[73] Assignee: Fujitsu Limited, Kawaski, Japan

[21] Appl. No.: 09/001,649

[22] Filed: Dec. 31, 1997

[30] Foreign Application Priority Data

Jun. 25, 1997 [JP] Japan ................................ 9-168212

[51] Int. Cl.$^6$ ........................ G11C 8/00; G11C 7/00
[52] U.S. Cl. .................. 365/233; 365/189.07; 365/191
[58] Field of Search .......................... 365/233, 189.01, 365/189.05, 189.07, 191

[56] References Cited

U.S. PATENT DOCUMENTS

| | | | |
|---|---|---|---|
| 5,394,373 | 2/1995 | Kawamoto | 365/230.06 |
| 5,566,108 | 10/1996 | Kitamura | 365/233 |
| 5,602,798 | 2/1997 | Sato et al. | 365/233 |

*Primary Examiner*—David Nelms
*Assistant Examiner*—Son Mai

*Attorney, Agent, or Firm*—Nikaido, Marmelstein, Murray & Oram LLP

[57] ABSTRACT

A semiconductor memory device, to which a plurality of command signals are supplied in synchronous with a clock, comprises a plurality of input circuits, having a sampling unit for inputting said command signals and said clock and sampling said command signals in synchronous with said clock, and an output unit for outputting said sampled command signals; a command decoder for receiving the command signals output by said plurality of input circuits, decoding said plurality of command signals and generating a corresponding control signal; a memory element, which implements a variety of operational modes in response to said control signals; an output timing signal generator circuit, having a circuit architecture equivalent to at least the sampling unit of said input circuit, for sampling a predetermined signal level in synchronous with said clock, and for generating an output timing signal based on the timing of the operational delay time of said sampling unit; and wherein said input circuit outputs said sampled command signals in response to said output timing signal.

14 Claims, 10 Drawing Sheets

OVERALL MEMORY CONFIGURATION

OVERALL MEMORY CONFIGURATION

INPUT CIRCUIT

OPERATION TIMING CHART OF FIG.2

FIG.6 HOLD PULSE GENERATOR

CLOCK-SYNCHRONIZED INPUT CIRCUIT AND SEMICONDUCTOR MEMORY DEVICE THAT UTILIZES SAME

BACKGROUND OF THE INVENTION

1. Field of the Invention

The present invention relates to a clock-synchronized input circuit, which inputs data signals in synchronous with a clock, and semiconductor memory device that utilizes same.

2. Description of the Related Art

In semiconductor devices, which are supplied with command data, write data and addresses in synchronous with an external clock, for example, semiconductor memory device such as synchronous DRAM, clock-synchronized input circuits are provided to receive these data signals. Generally, this clock-synchronized input circuit samples supplied data signals via a differential circuit activated by an external clock, converts that sampled data signal to an internal CMOS level signal and holds it via a latch circuit. In this case, a specification requires the fact that a supplied data signal has a higher or lower voltage level than a reference voltage by a predetermined voltage, for example.

FIG. 9 is a circuit diagram depicting an example of such an input circuit. In this example, the input circuit comprises a sampling unit 22, which samples externally-supplied data signals IN by comparing them to a reference voltage Vref, a latch circuit 16 for amplifying and latching nodes n10, n12, at which the results of this sampling is generated, a level conversion unit 18, which converts the levels of those latched outputs n14, n16 to internal CMOS levels, and a hold circuit 21, which latches and holds those outputs n18, n20. Further, the sampling unit 22 is activated by a transistor 15, which conducts by virtue of pulses 23 generated by an external clock CLK, and the latch circuit 16 is activated by a transistor 17, which conducts by virtue of the external clock CLK H level.

By way of explaining in rough terms the operation of the input circuit depicted in FIG. 9, p-type transistors 10, 11 conduct by virtue of the L level of the clock CLK, and both nodes n10, n11 achieve an H level reset state. Then, when a data signal is supplied to input IN and the clock CLK simultaneously rises, a pulse generator 14 generates a pulse signal 23 in synchronous with the rising edge of the clock CLK, causing the transistor 15 to conduct. This activates a differential circuit comprising transistors 12, 13 with a common source. The data signal IN and a reference voltage Vref are applied to the gates of transistors 12 and 13, respectively. This data signal IN is supplied at a predetermined voltage that is higher or lower than the reference voltage Vref. Therefore, the differential amplification of the transistors 12, 13 causes one of the transistors to conduct, one of the nodes n10, n11, which were reset to H level, is driven to L level, and data signal IN sampling is performed.

The H and L levels of these nodes n10, n11 are further amplified by the latch circuit 16, and latched one time. The latch circuit 16 is also activated by a transistor 17 made conductive by the H level of the external clock CLK. Therefore, sampling operations are implemented by the sampling unit 22 and latch circuit 16 in synchronous with the clock CLK.

Latch circuit 16 outputs n14, n16 are each converted to internal COMS (CMOS) levels by a level converter 18. Then, the level-converted signals at nodes n18, n20 are held by a latch circuit 21 comprised of inverters 19, 20. The latch circuit 21 holds the data signals even after the external clock CLK changes into L level.

When a command signal is supplied as a data signal to the input circuit depicted in FIG. 9, inverted and non-inverted command signals are output to those outputs Outx, Outz. Also, when an address signal is supplied as a data signal, that address signal is output as inverted and non-inverted signals.

The above-described input circuit samples an externally-supplied data signal by comparing it with a reference voltage to determine if it is H level or L level, and holds that sampled data signal. However, the time required for data signal sampling differs according to the size of the margin of the supplied data signal relative to the reference voltage. As a result, the timing of the conversion of the input circuit outputs Outx, Outz also differs according to the above-mentioned margin.

For example, with a synchronous DRAM, a plurality of command signals are supplied in synchronous with the rising edge of an external clock CLK, and these command signals are sampled and held by the respective input circuits. Then, these sampled command signals are decoded by a command decoder, and a variety of internal operations are controlled.

FIG. 10 is a timing chart for explaining the problems that arise when a plurality of command signals /CS, /RAS, /CAS, /WE, CKE are supplied. In this example, a plurality of command signals /CS, /RAS, /CAS, /WE, CKE are supplied based on the timing of the rising edges clk1 and clk2 of an external clock CLK. Now, hypothetically, let us assume that, of these command signals, the level of the chip select signal /CS has a sufficiently large margin relative to the reference voltage Vref, and, similarly, the row address strobe signal /RAS also has a relatively large margin, but, the column address strobe signal /CAS possesses a small margin.

The L level of the signals /CS, /RAS, /CAS supplied on the bases of rising edge clk1 timing are sampled and held in the input circuit. As a result, as depicted in the figure, the latched signals 30, 31, 32 make the transition to L level accompanied by a predetermined delay time. This delay time is the input circuit's operation time. As a result, what was an inactive state during period 36, becomes an auto-refresh mode in period 38 due to a combination of L levels of command signals /CS, /RAS, /CAS. An auto-refresh mode raises a memory word line in accordance with an internally-generated address, amplifies via a sense amplifier memory data stored in a memory cell and carries out rewrite.

Next, let us assume that the chip select signal /CS is supplied at L level, the row address strobe signal /RAS is supplied at H level, and the column address strobe signal /CAS is supplied at H level all on the basis of the rising edge clk2 timing of the external clock CLK. As explained above, since the /RAS signal has a relatively large margin, input circuit operational delay time is short, but because the /CAS signal has a small margin relative to the reference voltage, the operational delay time required for the input circuit to detect the H level is long. Therefore, the sampled and latched signal 32 corresponding to the /CAS signal is delayed more than the sampled and latched signal 31 corresponding to the /RAS signal. With the differential circuit architecture of the sampling element 22 depicted in FIG. 9, the difference in these operational delays is especially large in the case of an H level data signal IN.

In period 39, when this skewing is generated, both the /CS signal and the /CAS signal temporarily become L level, and are decoded as a read mode. Despite the fact that a no operation mode command signal combination (NOP), wherein all the command signals are H level, except the /CS signal having L level, is supplied on the basis of external clock rising edge clk2 timing, an L level state is generated for both the /CS signal and the /CAS signal internally due to the dispersion of the input circuit delay times accompanying the dispersion of the respective command signal margins. This temporarily generates a read mode internally as shown in period 39.

In the read mode, the sense amplifier is connected to a data bus and data is read from an output circuit. Normally, the capacitance load of a data bus is large, so that the sense amplifier cannot drive the data bus until a predetermined amount of time has elapsed following the rising of the word line and the activation of the sense amplifier. Therefore, when a transition to the read mode occurs at an unanticipated timing, like during period 39, the sense amplifier state can break down, and rewrite data can be destroyed even in the auto-refresh mode.

Even with command signal combinations other than those described above, malfunctions can occur by the generation of skewing in internally-latched signals from the differences in internal circuit delay times. Furthermore, this skewing is not limited to command signals, and decode circuit malfunctions can also be brought about by the occurrence of internal skewing with relation to a plurality of address signals.

SUMMARY OF THE INVENTION

Thus, an object of the present invention is to provide a clock-synchronized input circuit capable of making output timing match up even when data signal margins differ, and a semiconductor memory device that utilizes same.

Moreover, a further object of the present invention is to provide in an input circuit, which samples and holds a plurality of data signals in synchronous with a clock, a clock-synchronized input circuit designed so that skewing does not occur internally in a plurality of data signals, and a semiconductor memory device that utilizes same. To achieve the above-described objects, a semiconductor memory device, to which a plurality of command signals are supplied in synchronous with a clock, comprises: a plurality of input circuits, having a sampling unit for inputting said command signals and said clock and sampling said command signals in synchronous with said clock, and an output unit for outputting said sampled command signals; a command decoder for receiving the command signals output by said plurality of input circuits, decoding said plurality of command signals and generating a corresponding control signal; a memory element, which implements a variety of operational modes in response to said control signals; an output timing signal generator circuit, having a circuit architecture equivalent to at least the sampling unit of said input circuit, for sampling a predetermined signal level in synchronous with said clock, and for generating an output timing signal based on the timing of the operational delay time of said sampling unit; and wherein said input circuit outputs said sampled command signals in response to said output timing signal.

In the above-described invention, the timing which outputs command signals sampled by an input circuit that samples the command signals, matches an output timing signal generated by an output timing signal generator circuit configured using a dummy input circuit. This timing is set at a fixed timing regardless of the size of the margin relative to the command signal reference voltage. Therefore, changes in command signals output from a plurality of input circuits occur all at once in synchronous with the output timing signal. Consequently, without the occurrence of skewing between the command signals supplied to the command decoder, the command decoder is prevented from generating erroneous control signals.

Moreover, when a clock-synchronized input circuit performs sampling in addition to holding and outputting the sampled signals, the above-described output timing signal becomes a hold timing signal or hold pulse.

Furthermore, by configuring an output timing signal generator circuit so as to sample the level of a command signal with a small margin, the output timing signal is set to the slowest timing, or a timing proportionate to that, regardless of the size of the command signal margin.

DESCRIPTION OF THE PREFERRED EMBODIMENT

The following is an explanation of the preferred embodiment of the present invention described in accordance with the figures. However, the technological scope of the present invention is not limited to such a preferred embodiment.

Figure 1:
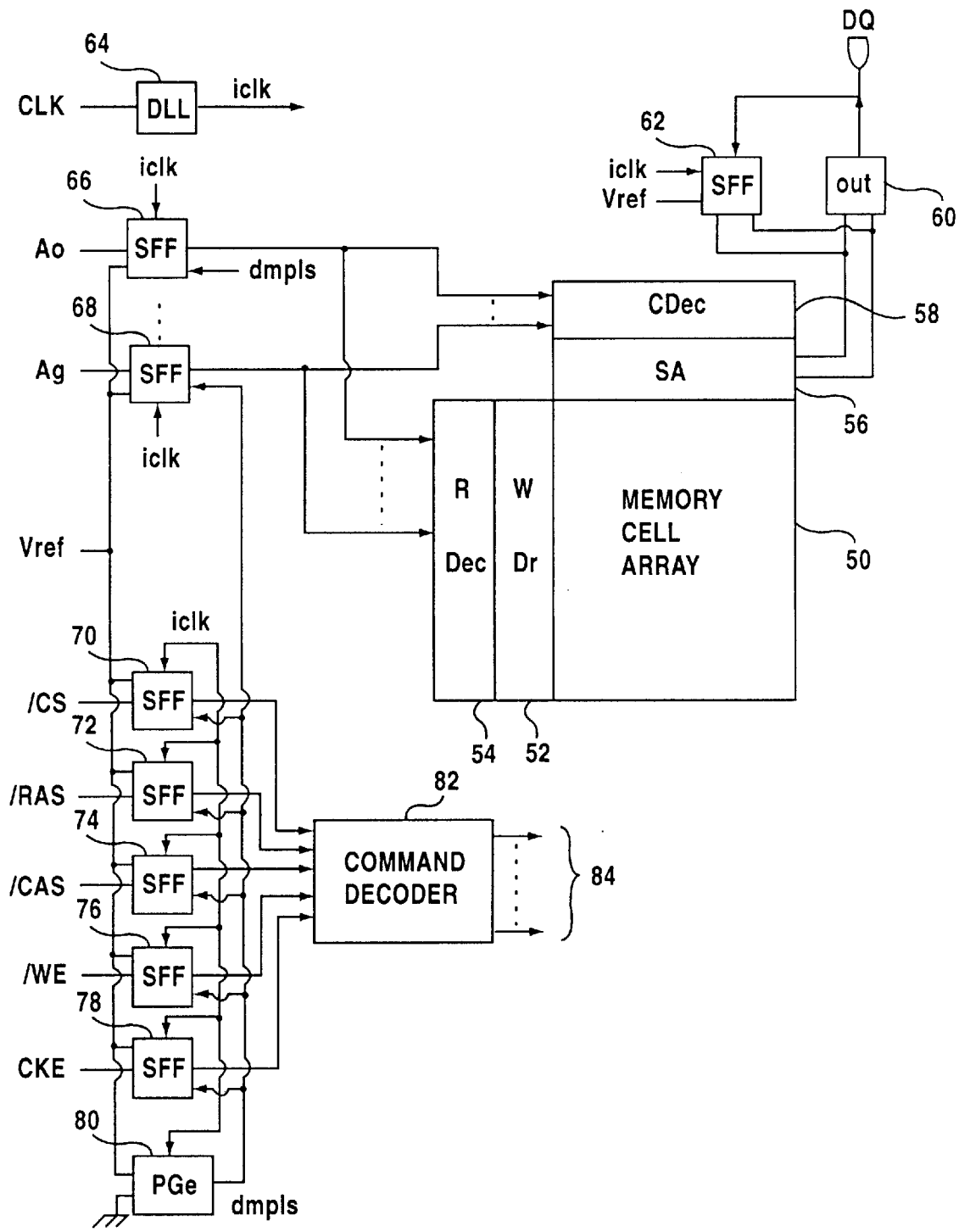
FIG. 1 depicts the overall configuration of the memory of an embodiment related to the present invention.

FIG. 1 depicts the overall configuration of a memory of an embodiment related to the present invention. For example, this memory comprises a memory cell array 50, comprising a plurality of memory cells having a single transistor and a single memory capacitor, and a plurality of word lines and bit lines, and a row decoder 54 and word line driver 52, and a column decoder 58 and sense amplifier column 56. Furthermore, a data output circuit 60 and data input circuit 62 are connected to the sense amplifier column 56.

Further, an external clock CLK is supplied, and an internal clock iclk phase-synchronized to the external clock CLK is generated for example by a delayed phase-locked loop circuit 64. Address signals A0–A9 and command signals /CS, /RAS, /CAS, /WE, CKE are sampled and held in synchronous with the clock by the respective corresponding input circuits 66–78. An external reference voltage Vref is supplied to these input circuits 66–78, and used to determine the level of data signals, such as address signals, command signals and write data signals. Of course, the reference voltage Vref can also be generated internally. The input circuits described here determine the level of externally-supplied data signals in direct relation to a reference voltage Vref, and since the data signals are supplied externally, their margins relative to the reference voltage Vref are not uniform.

Command signals sampled and held by input circuits 70–78 are supplied to a command decoder 82, where an internal control signal 84 of a mode corresponding to a command signal combination is generated. The operation of each internal circuit is controlled in accordance with this control signal. Furthermore, address signals sampled and held by input circuits 66, 68 are supplied to a row decoder 54 and a column decoder 58.

In the memory depicted in FIG. 1, a hold pulse dmpls, which supplies the hold timing to the input circuits 66–70, is supplied, and the timing of the outputs of the sampling data from these input circuits 66–70 is controlled so that the outputs align with one another. Thus, the hold pulse dmpls has a timing that aligns to the delay times of the corresponding input circuits when an external data signal has an input level of a minimum input margin. This kind of hold pulse dmpls is generated by a hold pulse generator 80.

Therefore, the timing of the sampling outputs of the input circuits 66–70 match up regardless of the input margins of the input data signals. Consequently, the internal command signal skewing described with reference to a conventional example does not occur, preventing malfunctions. The hold pulse dmpls does not necessarily have to be a pulse signal; it can simply be an output timing signal, which controls the timing of the sampled outputs of the input circuits.

Figure 2:
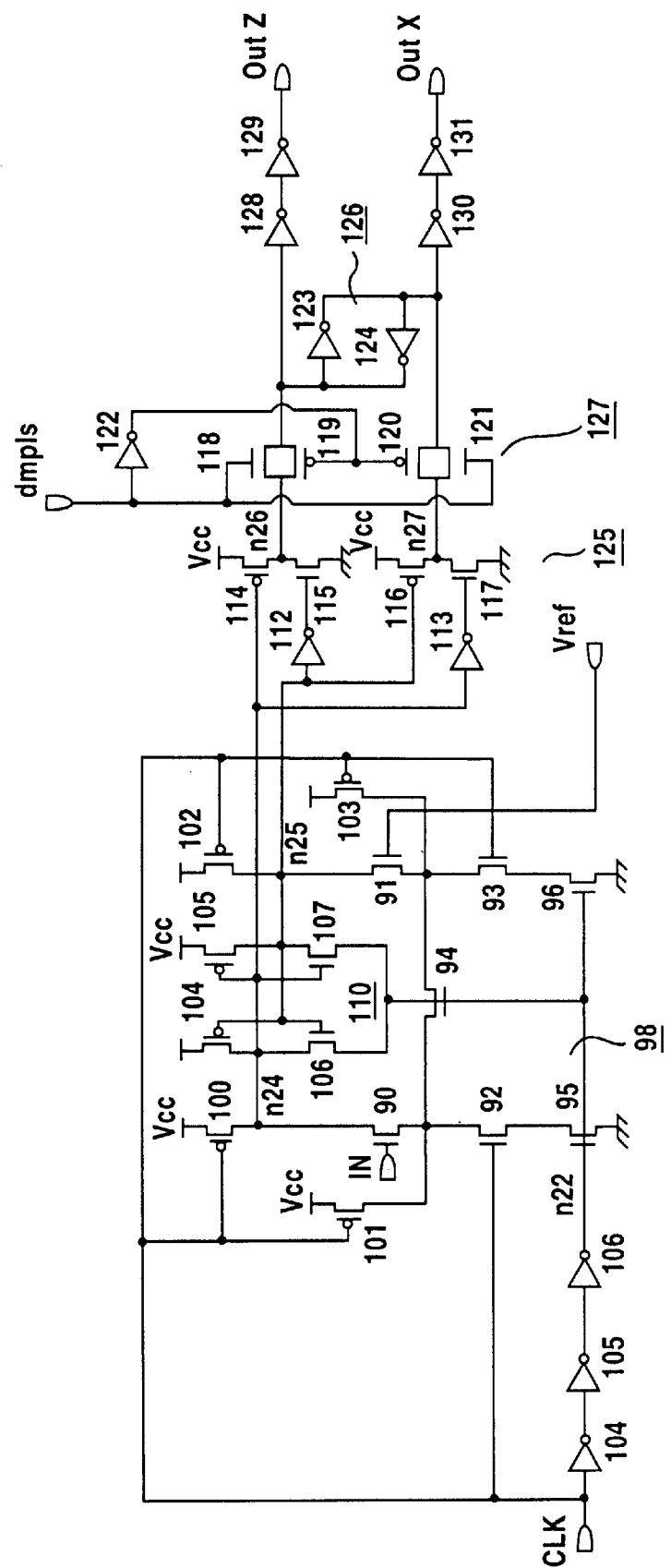
FIG. 2 is a detailed circuit diagram of an input circuit.
Figure 3:
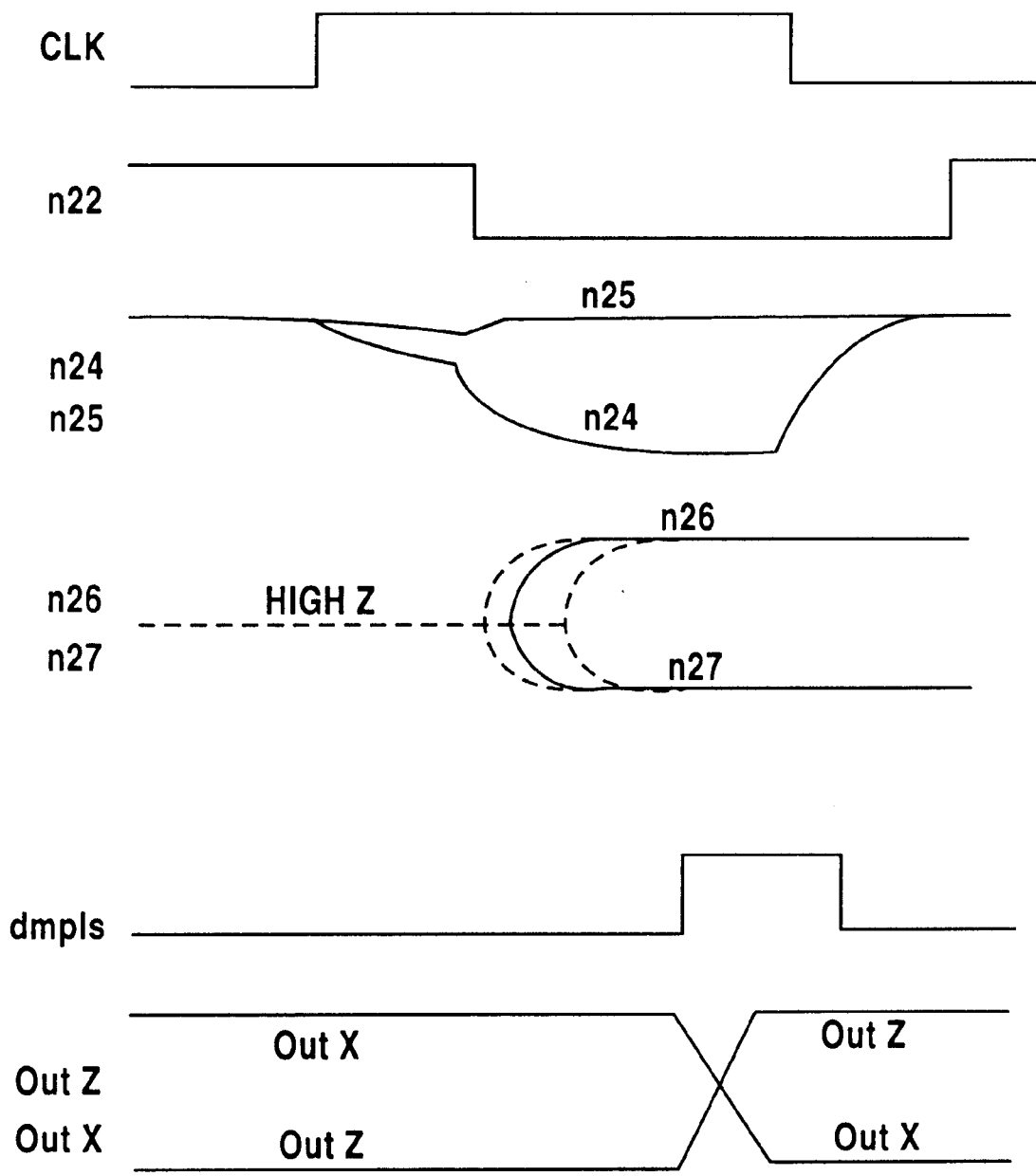
FIG. 3 depicts an operational timing chart of an input circuit.

FIG. 2 depicts a detailed circuit diagram of the input circuits 66–78 described above. And FIG. 3 depicts an operational timing chart of that circuit. In FIG. 2, p-type transistors are distinguished from n-type transistors by circular symbols attached to their gates. This circuit comprises a sampling element 98, which determines whether an input data signal IN is H or L level with relation to a reference voltage Vref, a latch circuit 110, which senses, amplifies and latches the result of that sampling one time, a level converter 125, which converts that latched signal to a COMS (CMOS) level, a CMOS transfer gate 127 controlled by a hold timing signal dmpls, and a hold circuit 126.

The sampling unit 98 is configured from a differential amplifier, comprising an n-type transistor 90, to whose gate a data signal IN is supplied, and an n-type transistor 91, to whose gate a reference voltage Vref is supplied. When transistors 92, 93, 95, 96 conduct in synchronous with the rising edge of an external clock CLK, this differential amplifier is activated, and a determination is made as to whether the data signal IN is higher or lower than the reference voltage Vref.

The outputs of the sampling unit 98 comprising a differential amplifier are generated to nodes n24, n25, and are sensed, amplified and latched one time by a CMOS latch circuit 110. This latch circuit 110 is also activated in synchronous with the H level of the external clock CLK. The output of the latch circuit 110 is converted to the CMOS level by a level converter 125, and when the CMOS transfer gate 127 conducts, a latch circuit 126 holds that output.

The operation of the above-described input circuit is as follows. Initially, let us assume that the latch circuit 126 is holding output Outz at L level and output Outx at H level by virtue of an L level data signal IN, and that an H level is supplied as a new data signal IN. First, as shown in FIG. 3, when the external clock CLK is L level, it is in the reset state, and p-type transistors 100, 102, 101, 103, respectively, are in conductive states. Therefore, the nodes n24, n25 are maintained at H level. By virtue of the H level of the nodes n24, n25, transistors 114–117, which comprise the level converter 125 CMOS inverter, are all in a non-conductive state, and nodes n26, n27 are both in a high impedance state (High Z). In the reset state, the node n22 is at H level, and transistors 95, 96 are in conductive states. However, since transistors 92, 93 are non-conductive, the sampling circuit 98 is in an inactive state, and, since the node n22 is H level, the latch circuit 110 is also in an inactive state.

At that point, when a signal of a predetermined level is supplied to the data signal IN, and the external clock CLK rises, the p-type transistors 100–103 cease to conduct and transistors 92, 93 conduct. In line with this, since transistors 95 and 96 are already in a conductive state, sampling circuit 98 is activated. As described above, if the data signal IN is at H level, the transistor 90 conducts, and the level of the node n24 is lowered. The rise of the external clock, after a delay time brought on by inverters 104, 105, 106, drives the node n22 to L level, turns OFF the transistors 95, 96 and terminates the differential amplification operation of the sampling circuit 98.

However, the common source of the transistors 106, 107 in the CMOS latch circuit 110 is lowered by the fall of the node n22, putting it in an active state. Therefore, the slight voltage differences generated to nodes n24 and n25 by the conduction of transistor 90 is sensed and amplified by the CMOS latch circuit 110. That is, the differential amplifier-configured sampling circuit 98 described above comprises a data signal IN pre amplifier function, and the latch circuit 110, comprises a main amplifier function. Therefore, the sampling circuit 98 and latch circuit 110 comprise a data signal IN sampling function.

Now, the level of the nodes n24, n25 is amplified to the power source Vcc and ground level by the latch circuit 110, which is activated by the fall of node n22. As a result, transistor 114 conducts, node n26 is raised to H level, transistor 117 conducts and node n27 is lowered to L level. As explained with reference to a conventional example, when the level of the data signal IN possesses a sufficiently large margin by comparison to the reference voltage Vref, the above-described sampling operation of the sampling circuit 98 and latch circuit 110 is performed at high speed. Conversely, when the data signal IN margin is small, the sampling operation of the sampling circuit 98 and latch circuit 110 is delayed. That is, the situation is as depicted in FIG. 3 by the broken line indicating the signal waveforms of nodes n26, n27.

The input circuit depicted in FIG. 2 holds the H level and L level generated to the nodes n26, n27 in the hold circuit 126 and generates output Outx, Outz. The hold circuit 126 comprises inverters 123, 124. And inverters 128–131 are for waveform shaping. The timing of the hold pulse dmpls described above is set so that it aligns with operational delay times of the sampling circuit 98 and latch circuit 110, when, for example, the data signal IN margin is the smallest. By doing this, as shown in FIG. 3, outputs Outx, Outz are switched by a fixed hold pulse dmpls timing regardless of the timing generated by the nodes n26, n27.

Figure 4:
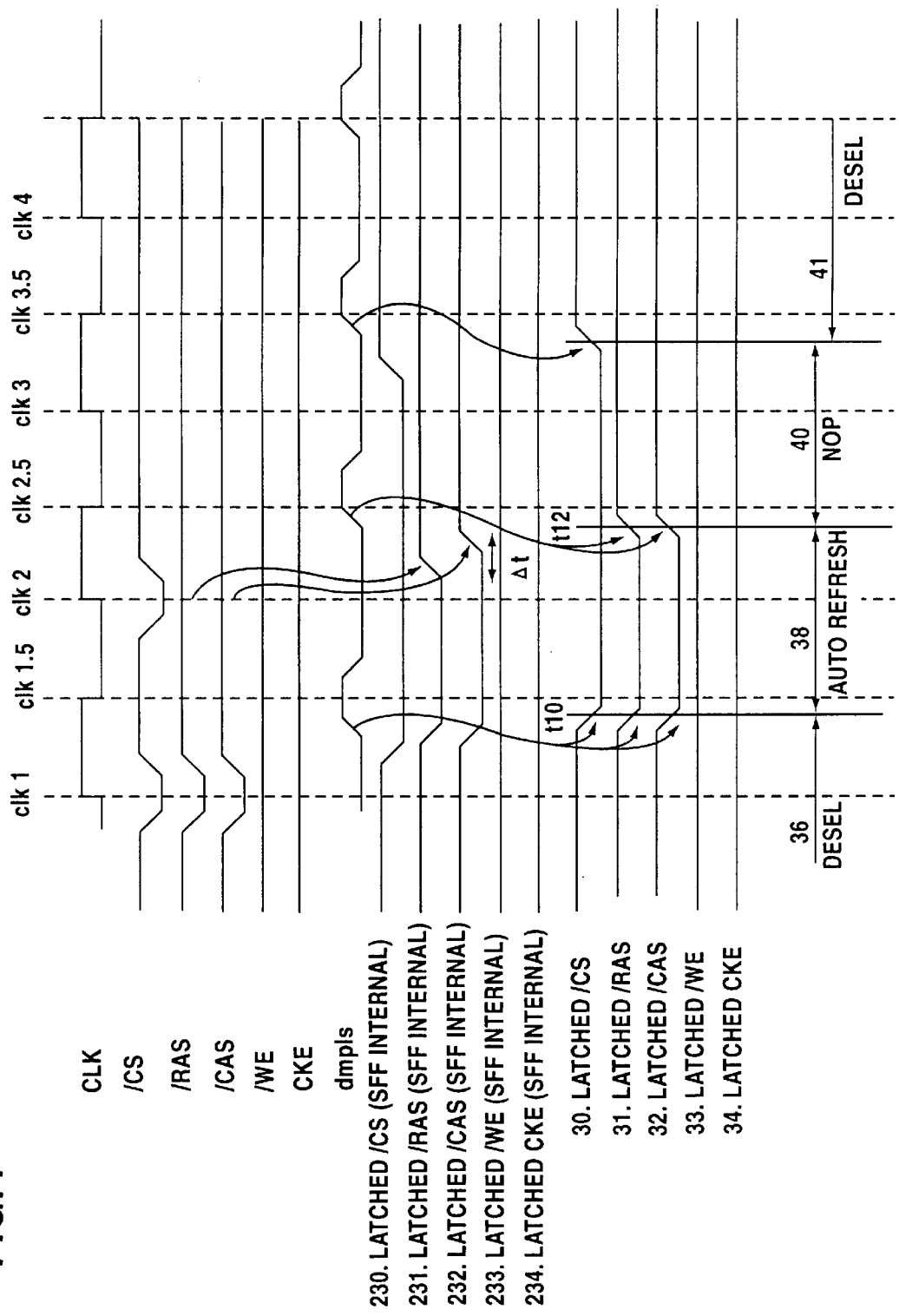
FIG. 4 depicts a timing chart when a plurality of command signals are supplied.

FIG. 4 depicts a timing chart for when a plurality of command signals are supplied when using the input circuit depicted in FIG. 2. This corresponds to FIG. 10. For the sake of comparison, the operation depicted in FIG. 4 will also be explained using an example, wherein command signals /CS, /RAS, /CAS are all supplied at L level on the basis of external clock CLK timing clk1, and based on timing clk2, command signal /CS remains at L level while command signals /RAS, /CAS both make the transition to H level.

In FIG. 4, the operation of the input circuit is explained using an example, wherein command signals /CS, /RAS, /CAS are supplied at L level on the basis of timing clk1, and based on timing clk2, command signal /CS remains at L level while command signals /RAS, /CAS both make the transition to H level.

The internal latched signals 230–234 generated to nodes n26, n27 in the input circuit are depicted in FIG. 4 as corresponding to command signals /CS, /RAS, /CAS, /WE, CKE, respectively.

The L levels of command signals /CS, /RAS, /CAS supplied at external clock CLK rise timing clk1 are sampled in the input circuit, and are output to outputs Outx, Outz as latched command signals 30–34, respectively, at hold pulse dmpls rise timing. Therefore, at time t10 timing, command signals 30, 31, 32 all become L level. Therefore, skewing does not occur during periods 36 and 38.

The L levels of command signals /CS, /RAS, /CAS are supplied to the command decoder 82 depicted in FIG. 1 at time t10 timing, where they are decoded, and the auto-refresh mode is detected. Therefore, predetermined word lines (not depicted in the figure) inside the memory cell array are driven, and data inside the memory cells are amplified to the sense amplifier 56 through the bit lines, and rewritten.

Next, the H levels of command signals /RAS, /CAS supplied at external clock CLK rise timing clk2 are sampled in the input circuit. In this case, too, since the level margin of command signal /RAS is relatively large, and the level margin of command signal /CAS is small, the internal latched signal 232 corresponding to command signal /CAS is delayed more than internal latched signal 231 by the Δt shown in the figure. However, because the outputs of the input circuits are generated all at once by the hold pulse dmpls, the H levels of command signals /RAS, /CAS simultaneously make the transition to H level at time t12. That is, skewing does not occur.

Figure 10:
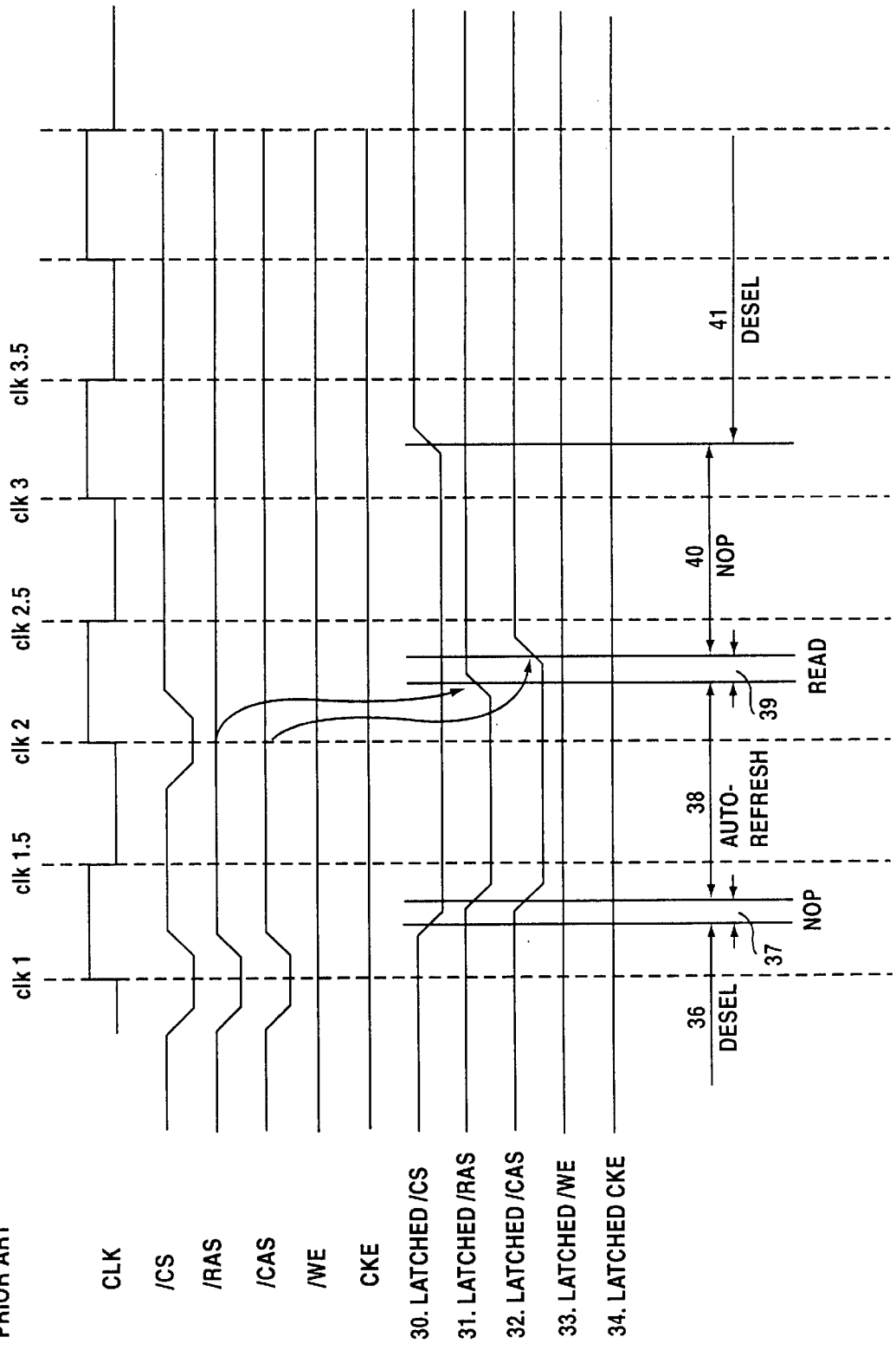
FIG. 10 depicts a timing chart for explaining the problems that occur when a plurality of command signals is supplied.

As a result, a read mode as shown in FIG. 10, is not detected between period 38 and period 40, making it possible to eliminate the cause of malfunctions like those described with reference to the conventional example.

As explained above, the generation timing of the above-described hold pulse dmpls can be set so that skewing does not occur even under the worst input circuit sampling delay times. The following, then, is an explanation of the circuit that generates the hold pulse dmpls.

Figure 5:
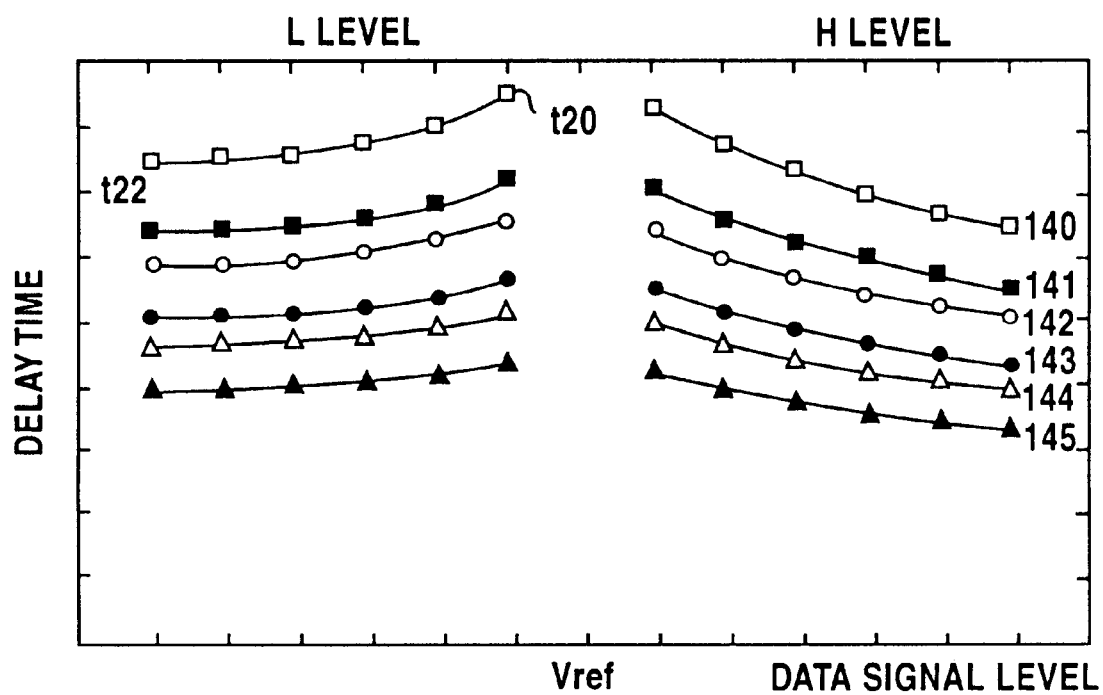
FIG. 5 depicts operational delay time characteristics of an input circuit.

FIG. 5 depicts delay time characteristics of the sampling operations of the sampling circuit 98 and latch circuit 110 depicted in FIG. 2. The levels of the data signals IN are represented along the horizontal axis, and operational delay times are represented along the vertical axis. Because the reference voltage Vref is indicated in the center of FIG. 5's horizontal axis, the left side of FIG. 5 depicts operating delay times when data signals IN are L level, and the right side depicts operational delay times when data signals IN are H level, respectively. The respective delay characteristics when transistor threshold voltage is high (140, 141 in figure), medium (142, 143 in figure) and low (144, 145 in figure) are also depicted in FIG. 5. And operating temperatures are also depicted by distinguishing between when they are high (140, 142, 144 in figure) and low (141, 143, 145 in figure).

As depicted in FIG. 5, the input circuit operational delay time tends to become shorter in the high level or low level, when the level of the data signal IN possesses a sufficient margin relative to the reference voltage Vref. This is clear from the operating characteristics of the sampling circuit 98, which performs differential amplification operations, and the latch circuit 110, which amplifies the differential output of that sampling circuit.

In addition, when the data signal IN is L level, if the difference with the reference voltage Vref increases beyond a certain point, the corresponding operational delay time does not grow any shorter. By contrast, when the data signal IN is H level, the greater the difference with the reference voltage Vref, the shorter the operational delay time becomes. The reason for this is because when the data signal IN is L level, as that level approaches ground level, it falls below the threshold voltage of the transistor 90, and the transistor 90 stops conducting. Therefore, when the L level of the data signal IN is extremely low, differential operations with transistors 90 and 91 are no longer performed, and only transistor 91 drive operations are carried out using the reference voltage Vref. Conversely, because the H level side of a data signal IN performs differential operations with transistors 90 and 91 even when it increases to the power source Vcc level, the higher the level of the data signal IN, the shorter the operational delay time. Therefore, the L level side of a data signal IN does not differ that much from the delay time, whereas the H level side differs greatly.

Thus, in the above-described characteristics, if hold pulse dmpls generation timing exhibits characteristic 140, this timing should be set at t20, the longest delay time. This is because, such a timing makes it possible to generate input circuit outputs at the same time regardless of the level margins of the data signals IN.

Figure 6:
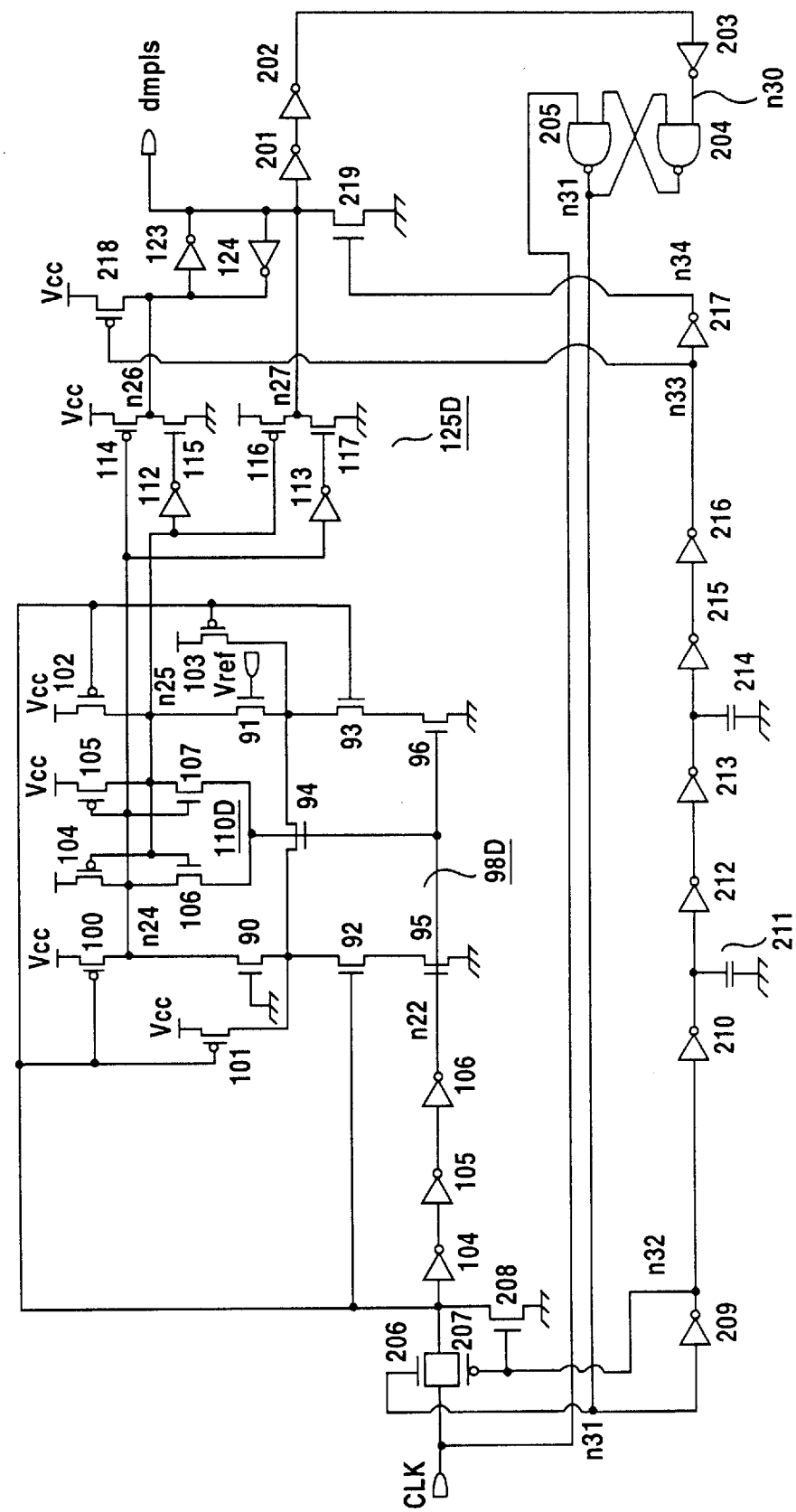
FIG. 6 depicts an example of a hold pulse dmpls generator.

FIG. 6 depicts an example of a hold pulse dmpls generator. This generator is essentially the same circuit configuration as that of the input circuit depicted in FIG. 2, and the hold pulse dmpls is generated to a node n27. The configurations of a dummy sampling unit 98D, dummy latch circuit 110D and dummy level converter 125D are the same as corresponding circuits 98, 110, 125, respectively, in the FIG. 2 input circuit, and the reference numbers 90–117 of each of the circuit elements have also been assigned to corresponding circuit elements. Further, reference numbers 201–219 indicate newly-added circuit elements.

In view of FIG. 5 input circuit delay characteristics, a ground level is applied to input to the FIG. 6 hold pulse generator. That is, the gate of transistor 90 is connected to a ground. As a result, when the data signal IN of the input circuit depicted in FIG. 2 is ground level, the hold pulse generator depicted in FIG. 6 generates a hold pulse dmpls on the basis of the signal timing generated to the node n27. As is clear from the characteristics diagram depicted in FIG. 5, when a ground level data signal IN is supplied, operational delay time is t22, an operational delay time that approaches the worst operational delay time t20. Moreover, since the pulse generator comprises the same circuitry as the input circuit, it can constantly generate hold pulses dmpls at stable delay time t22 timing approaching the worst operational delay time t20, even when fluctuations occur in transistor threshold voltage due to process irregularities.

Moreover, the rise of hold pulses dmpls cause a CMOS transfer gate 127 to conduct in the FIG. 2 input circuit. In view of the time required to achieve this conduction, according to the hold pulse dmpls generated at delay time t22 timing, it is so designed that the transfer gate 127 conducts at delay time t20, the worst delay time. Therefore, the hold pulse generator can stably generate hold pulses dmpls at timings that align with input circuit operation.

Next, the operation of the hold pulse generator depicted in FIG. 6 is explained. First, in the reset state, node n26 is maintained at H level, and node n27 is maintained at L level. Therefore, the hold pulse dmpls is in an L level state. A latch circuit comprising NAND gates 204 and 205 holds node n31 at H level. This puts transistors 206 and 207 in a conductive state. And the H level of node n31 puts node n33 at H level, node n34 at L level, and transistors 218, 219 in a nonconductive state. Further, the L level of the external clock CLK causes transistors 100–103 to conduct, and puts nodes n24 and n25 at H level. And dummy sampling circuit 98D and dummy latch circuit 110D are not supplied with current and enter an inactive state.

Then, when the clock CLK changes to H level, the transistors 92, 93, 95, 96 simultaneously enter a conductive state, just for the duration of the inverters' 104, 105, 106 delay time from the clock's rising edge, the dummy sampling circuit 98D is activated, and the ground level connected to the transistor 90 gate is sampled. More specifically, transistor 91 conducts, and the level of node n25 is lowered. Then, the transition of node n22 to L level activates the dummy latch circuit 110D, which detects a microvoltage between the nodes n24, n25, and amplifies this microvoltage to the power source Vcc and ground level. Then, the L level of node n25 causes transistors 115 and 116 to conduct, puts node n26 at L level and puts node n27 at H level. As a result, the hold pulse dmpls changes to H level, and that state is held by a latch comprising inverters 123, 124.

The operation up to this point has been the same as the input circuit depicted in FIG. 2, and conforms to the timing chart depicted in FIG. 3. Therefore, the timing by which the hold pulse dmpls makes the transition to H level is the same as the sampling operation delay time t22, when a ground level is supplied as a data signal IN to the input circuit.

When node n27 makes the transition to H level, nodes n30 and n31 become L level through inverters 201, 202, 203. A latch comprising NAND gates 205, 206 holds that state. The L level of node n31 makes transistors 206, 207 nonconductive, makes transistor 208 conductive, and puts dummy sampling circuit 98D and dummy latch 110D both in an inactive state. Further, following the delay time of a delay circuit, comprising inverters 210–216 and capacitors 211, 214, node n33 becomes L level and node n34 becomes H level. As a result, reset transistors 218 and 219 conduct, node n26 resets to H level and node n27 resets to L level. Accordingly, the hold pulse dmpls makes the transition from H level to L level. That is, the hold pulse dmpls has a pulse width of the delay time of the delay circuit.

The L level of node n27 once again puts nodes n30, n31 in a H level reset state, and following delay circuit delay time, node n33 becomes H level, node n34 becomes L level, and transistors 218 and 219 both enter a nonconductive state. That is, a reset state.

An L level voltage that possesses a minimum margin relative to a reference voltage Vref can also be applied to a transistor 90 gate in the hold pulse generator described above. In this case, the timing that generates a hold pulse dmpls is set at time t20 depicted in FIG. 5. But there are times when it is difficult to accurately generate an intermediate level of such a power source and ground. Therefore, a circuit can be simplified by applying a ground potential to a transistor 90 gate as described above.

Figure 7:
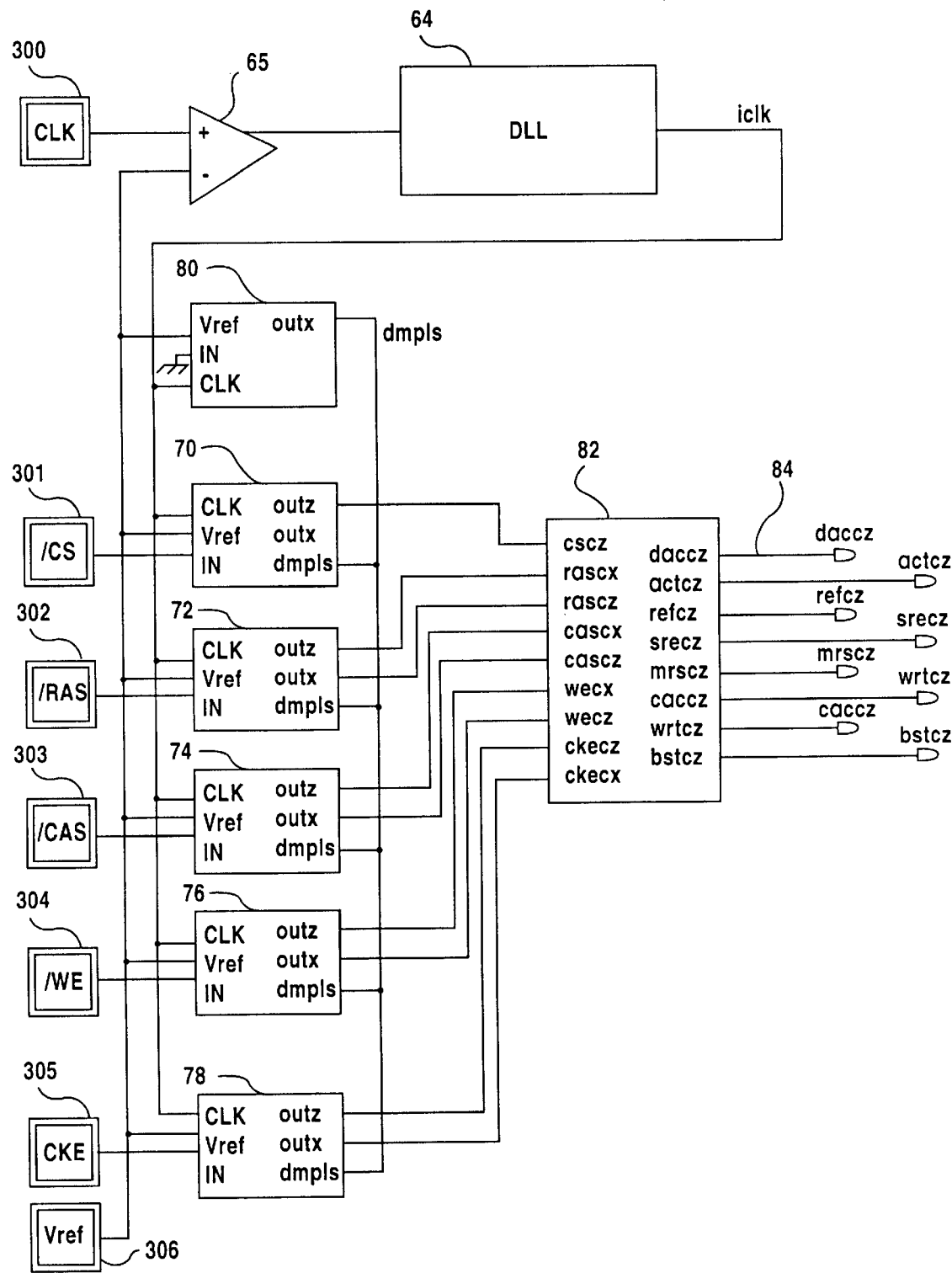
FIG. 7 is a circuit diagram depicting an input circuit and command decoder for a command signal.

FIG. 7 is a circuit diagram depicting an input circuit and command decoder for a command signal. It has the same configuration as the input circuit depicted in FIG. 1. An external clock CLK is applied from a terminal 300, a reference voltage Vref is applied from a terminal 306, and command signals /CS, /RAS, /CAS, /WE, CKE are applied from terminals 301–305, respectively. The external clock CLK and reference voltage Vref are supplied to a delayed phase-locked loop circuit 64 via an input buffer 65, and the delayed phase-locked loop circuit 64 generates an internal clock iclk phase-synchronized to the external clock CLK. This internal clock iclk is supplied to the respective input circuits 70–78.

The internal clock iclk is supplied as the clock CLK to a hold pulse generator 80, and an input terminal IN is connected to a ground level. A reference voltage Vref is also supplied. Then, as described above, a hold pulse dmpls is generated in alignment with the longest delay time in an input circuit. This hold pulse dmpls is supplied to the respective input circuits 70–78.

The input circuits 70–78 input each command signal, sample the levels thereof, and generate inverted, non-inverted signals on the basis of hold pulse dmpls timing to two outputs Outx, Outz. These generated signals are supplied to a command decoder 82, and a decoded control signal 84 is output.

Figure 8:
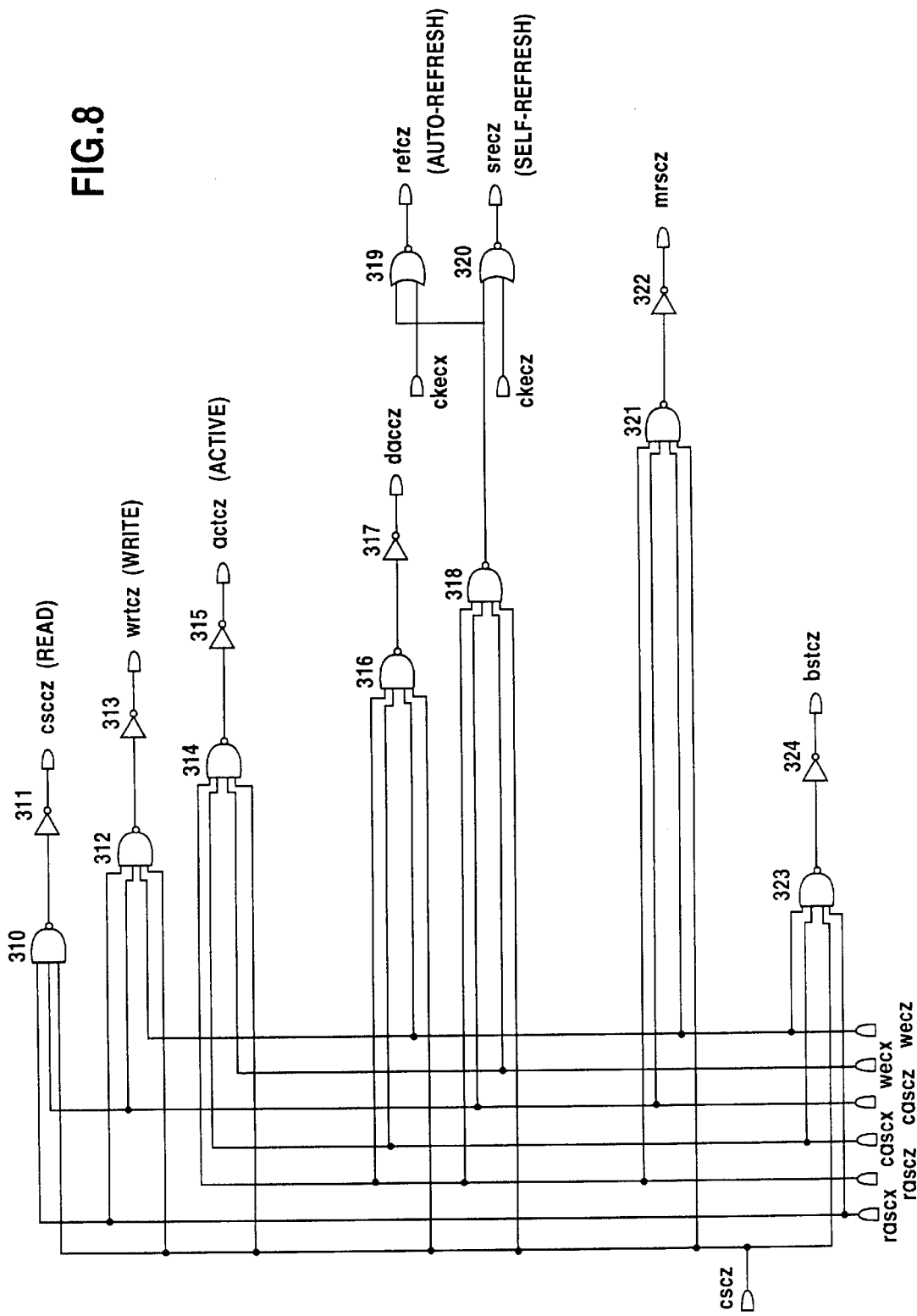
FIG. 8 depicts a detailed circuit diagram of a command decoder.
Figure 9:
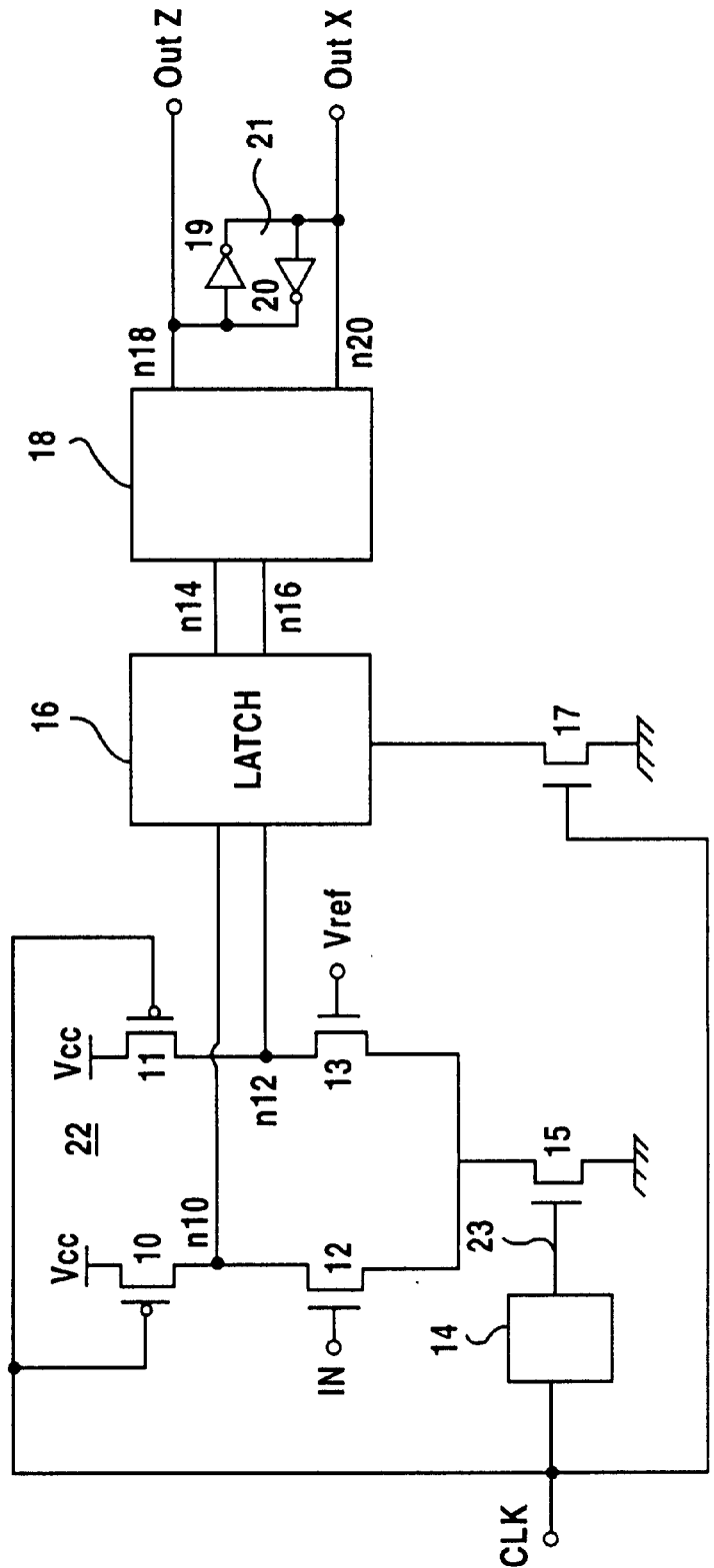
FIG. 9 is a circuit diagram depicting an example of an input circuit.

FIG. 8 depicts a detailed circuit diagram of the above-described command decoder 82. Command signals cscz, rascx, rascz, cascx, cascz, wecx, wecz, ckecx, ckecz generated by the input circuits 70–78 are supplied as an input signal. A control signal cscz corresponding to a read mode is generated by a NAND gate 310 and inverter 311. And a control signal wrtcz corresponding to a write mode is generated by a NAND gate 312 and inverter 313. In addition, a control signal actcz corresponding to an active mode is generated by a NAND gate 314 and inverter 315. In addition, a control signal daccz corresponding to a precharge mode is generated by a NAND gate 316 and inverter 317. In addition, a control signal refcz corresponding to an auto-refresh mode and a control signal srecz corresponding to a self-refresh mode, respectively, are generated by a NAND gate 318, and NOR gates 319, 320. And, a control signal mrscz corresponding to a mode register set mode is generated by a NAND gate 321 and inverter 322. In addition, a control signal bstcz corresponding to a burst stop mode is generated by a NAND gate 323 and inverter 324.

Since the plurality of command signals supplied to this command decoder 82 do not possess skewing, the command decoder 82 does not detect erroneous, unintended operation modes. And, when output signals are similarly generated all at once on the basis of hold pulse dmpls timing in an address signal input circuit, the respective address decoders do not select an incorrect word line or column.

The above-described embodiment is an example of an input circuit comprising a hold circuit, but even when an input circuit comprises a circuit that samples externally-supplied data signals but does not comprise a hold circuit, internal signal skewing can be eliminated by using signals that control output timing in a similar fashion.

As explained above, according to the present invention, when a plurality of data signals, such as command signals and address signals, are supplied in synchronous with an external clock, because the output of the input circuits thereof can be output on the basis of the slowest timing of an anticipated delay time, skewing does not occur between the output signals thereof. Therefore, skewing does not occur between a plurality of command signals in particular, and is not the cause of malfunctions brought on by a command decoder decoding those signals into an incorrect command.

What is claimed is:

1. A clock-synchronized input circuit, having a sampling unit for sampling, in synchronous with a clock, a data signal supplied in synchronous with said clock, and a hold circuit for holding and outputting said sampled signal, comprising:

a plurality of said input circuits; and a hold timing generator circuit, having a circuit architecture equivalent to at least the sampling unit of said input circuit, for sampling a predetermined signal level in synchronous with said clock, and for generating a hold timing signal based on the timing of the operational delay time of said sampling unit;

wherein said input circuit holds and outputs said sampled signal at the hold circuit in response to the hold timing signal.

2. A clock-synchronized input circuit according to claim 1, wherein the sampling unit of said input circuit comprises a first transistor to whose gate said data signal is supplied, and a second transistor to whose gate an intermediate reference voltage of H level and L level of said data signal is supplied, a current is supplied to said first and second transistors in synchronous with said clock, and a sampled signal to the drains of said first and second transistors is generated in accordance with the level of said data signal; and the sampling unit of said hold timing signal generator circuit comprises a third transistor to whose gate said predetermined signal level is supplied, and a fourth transistor to whose gate said reference voltage is supplied, a current is supplied to said third and fourth transistors in synchronous with said clock, a sampled signal to the drains of said third and fourth transistors is generated in accordance with the level of said predetermined signal level, and said hold timing signal is generated in response to said sampled signal.

3. A clock-synchronized input circuit according to claims 1 or 2, wherein said hold timing signal is a hold pulse with a predetermined pulse width.

4. A clock-synchronized input circuit according to claim 2, wherein said predetermined signal level is equivalent to a level of a data signal when said data signal has a minimum margin relative to said reference voltage.

5. A clock-synchronized input circuit according to claim 2, wherein said predetermined signal level is a ground potential.

6. A clock-synchronized input circuit according to claim 1, wherein said input circuit comprises a transfer gate between said sampling unit and hold circuit, and the transfer gate conducts in response to said hold timing signal.

7. A clock-synchronized input circuit according to claim 1, wherein said hold timing signal comprises timing, by which the output of said plurality of input circuits is generated substantially simultaneously regardless of the size of the margin of said data signal relative to the reference voltage.

8. A semiconductor memory device, to which a plurality of command signals are supplied in synchronous with a clock, comprising:

a plurality of input circuits, having a sampling unit for inputting said command signals and said clock and sampling said command signals in synchronous with said clock, and a hold circuit for holding and outputting said sampled command signals;

a command decoder for receiving the command signals output by said plurality of input circuits, decoding said plurality of command signals and generating a corresponding control signal;

a memory element, which implements a variety of operational modes in response to said control signal;

a hold timing signal generator circuit, having a circuit architecture equivalent to at least the sampling unit of said input circuit, for sampling a predetermined signal level in synchronous with said clock, and for generating a hold timing signal based on the timing of the operational delay time of said sampling unit; and wherein said input circuit outputs said sampled command signals in response to said hold timing signal.

9. A semiconductor memory device according to claim 8, wherein the sampling unit of said input circuit comprises a first transistor to whose gate said data signal is supplied, and a second transistor to whose gate an intermediate reference voltage of H level and L level of said data signal is supplied, a current is supplied to said first and second transistors in synchronous with said clock, and a sampled signal to the drains of said first and second transistors is generated in accordance with the level of said data signal; and the sampling unit of said hold timing signal generator circuit comprises a third transistor to whose gate said predetermined signal level is supplied, and a fourth transistor to whose gate said reference voltage is supplied, a current is supplied to said third and fourth transistors in synchronous with said clock, a sampled signal to the drains of said third and fourth transistors is generated in accordance with the level of said predetermined signal level, and said hold timing signal is generated in response to said sampled signal.

10. A semiconductor memory device according to claims 8 or 9, wherein said hold timing signal is a hold pulse with a predetermined pulse width.

11. A semiconductor memory device according to claim 9, wherein said predetermined signal level is equivalent to a level of a pertinent command signal when said command signal possesses a minimum margin relative to said reference voltage.

12. A semiconductor memory device according to claim 10, wherein said predetermined signal level is a ground potential.

13. A semiconductor memory device according to claim 8, wherein said input circuit comprises a transfer gate between said sampling unit and hold circuit, and said transfer gate conducts in response to said hold timing signal.

14. A semiconductor memory device, to which a plurality of command signals are supplied in synchronous with a clock, comprising:

a plurality of input circuits, having a sampling unit for inputting said command signals and said clock and sampling said command signals in synchronous with said clock, and an output unit for outputting said sampled command signals;

a command decoder for receiving the command signals output by said plurality of input circuits, decoding said plurality of command signals and generating a corresponding control signal;

a memory element, which implements a variety of operational modes in response to said control signals;

an output timing signal generator circuit, having a circuit architecture equivalent to at least the sampling unit of said input circuit, for sampling a predetermined signal level in synchronous with said clock, and for generating an output timing signal based on the timing of the operational delay time of said sampling unit; and wherein said input circuit outputs said sampled command signals in response to said output timing signal.

* * * * *